United States Patent
LeClaire et al.

(10) Patent No.: US 8,293,019 B2
(45) Date of Patent: Oct. 23, 2012

(54) APPARATUS AND METHOD FOR INDIRECT SURFACE CLEANING

(75) Inventors: Jeffrey E. LeClaire, Boca Raton, FL (US); Kenneth G. Roessler, Boca Raton, FL (US); David Brinkley, Baltimore, MD (US)

(73) Assignee: Rave, LLC, Delray Beach, FL (US)

( * ) Notice: Subject to any disclaimer, the term of this patent is extended or adjusted under 35 U.S.C. 154(b) by 753 days.

(21) Appl. No.: 12/277,106

(22) Filed: Nov. 24, 2008

(65) Prior Publication Data

US 2009/0065024 A1   Mar. 12, 2009

Related U.S. Application Data

(63) Continuation of application No. 12/055,178, filed on Mar. 25, 2008, now Pat. No. 7,993,464.

(60) Provisional application No. 60/954,989, filed on Aug. 9, 2007.

(51) Int. Cl.
*B08B 7/00* (2006.01)
(52) U.S. Cl. .............. 134/1; 134/1.3; 134/42; 134/902
(58) Field of Classification Search .................. None
See application file for complete search history.

(56) References Cited

U.S. PATENT DOCUMENTS

| | | | | |
|---|---|---|---|---|
| 5,093,563 | A * | 3/1992 | Small et al. | 250/201.9 |
| 6,124,718 | A * | 9/2000 | Kawata | 324/750 |
| 6,949,147 | B2 * | 9/2005 | Uziel et al. | 134/1 |
| 7,253,901 | B2 | 8/2007 | Janik et al. | |
| 2003/0192567 | A1 | 10/2003 | Koizumi et al. | |
| 2005/0110985 | A1 * | 5/2005 | Yogev | 356/237.1 |
| 2006/0007433 | A1 * | 1/2006 | Ikuta et al. | 356/237.2 |
| 2006/0073679 | A1 * | 4/2006 | Airaksinen et al. | 438/478 |
| 2006/0127691 | A1 * | 6/2006 | Chiu et al. | 428/626 |
| 2008/0044740 | A1 * | 2/2008 | Lin et al. | 430/5 |
| 2008/0241711 | A1 * | 10/2008 | Yun et al. | 430/5 |

* cited by examiner

*Primary Examiner* — Michael Kornakov
*Assistant Examiner* — Nicole Blan
(74) *Attorney, Agent, or Firm* — Baker & Hostetler LLP

(57) ABSTRACT

Methods for cleaning a surface of a substrate and for increasing the useable lifetime of a photomask substrate are provided. In one method, a substrate has at least one radiation-produced particle disposed thereon, and a laser that has a wavelength that substantially coincides with a high absorption coefficient of the substrate is directed towards the substrate. A thermal increase is generated in the substrate, and the radiation-produced particle is removed from the substrate by transferring thermal energy from the substrate to the radiation-produced particle until the radiation-produced particle decomposes.

20 Claims, 13 Drawing Sheets

APPARATUS AND METHOD FOR INDIRECT SURFACE CLEANING

CROSS-REFERENCE TO RELATED APPLICATIONS

This application is a continuation of U.S. Nonprovisional patent application Ser. No. 12/055,178, filed on Mar. 25, 2008 now U.S. Pat. No. 7,993,464, which claims priority to U.S. Provisional Patent Application Ser. No. 60/954,989, filed on Aug. 9, 2007, the disclosures of which are incorporated by reference herein in their entirety.

FIELD OF THE INVENTION

The present invention relates generally to devices and methods useful in cleaning surfaces. More particularly, the present invention relates to devices and methods useful in cleaning surfaces of components typically used in the semiconductor industry, optics, etc. The devices and methods disclosed are applicable to extending the useful life of photomask reticles.

BACKGROUND OF THE INVENTION

Electromagnetic radiation has long been used for surface cleaning. Examples of these processes include the removal of surface contamination, removal of thin material layer coatings such as paints or removal of oils from metal work surfaces. Some of the earliest examples utilized flash lamp radiation sources. These systems can be limited in application because of peak powers achievable.

Lasers have increasingly been used for these types of processes because of the high peak powers achievable, high energy stability and wavelength selectivity. These features allow for high localization, improved material selectivity, and depth control of the cleaning effect. Laser surface cleaning processes can be broadly categorized into surface contamination layer removal and particulate removal. Removal of surface contamination layers is normally accomplished by laser ablation. Particle removal involves removing the contamination as a whole.

Cleaning processes under both categories can benefit from the use of pulsed laser radiation to provide higher peak powers. Short pulsed radiation in particular can provide improved processing. Short pulsed radiation has been shown to decrease the heat affected zone in laser ablation processing. This allows improved localization of the ablative removal as well as finer control of the removal depth. Short pulse radiation also can enhance particulate removal by increasing the rate of thermal increase within the particles and/or substrate thereby increasing the acceleration forces that produce particle removal.

Substrate damage can be an issue for both ablative and particulate removal processes and several techniques have been developed to minimize these effects. For ablative processes, selecting a wavelength that increases the absorption of the contaminant can reduce the fluence requirement and therefore reduce substrate damage. In addition, using multiple pulses for full contaminant removal can reduce the required fluence. However, substrates that have high absorption at the selected wavelengths are likely to be ablated along with the contamination, even with wavelength selection and multiple pulse removal processes. The ability to end stop the removal process at the substrate interface will be limited in these cases. This problem is significantly increased for smaller size contamination, since the absorption cross section for the contamination is reduced relative to the substrate.

As with ablative removal processes, particulate removal processes can also cause substrate damage for sensitive substrates and substrates that have high absorption at the processing wavelength. This problem is increased for small particle removal because of increased adhesion forces between the particles and substrate and self focusing of the laser underneath the particles. For particle cleaning processes, the developed devices and methods for reducing the risk of substrate damage involve controlling the environment above the contaminated surface. Examples of particulate laser processes allowing reduced fluence levels include wet laser cleaning, steam laser cleaning, and increased humidity cleaning. Combinations of laser and other cleaning processes (including etching, organic solvents, and ultrasonic) have been shown to increase cleaning effectiveness and may reduce the risk of substrate damage. However, with the exception of dry laser cleaning processes, all of the particulate removal processes described require access to the environment above the substrate surface. This may be impractical for some systems.

Alternative dry laser particulate cleaning processes have been developed. Laser acoustic wave cleaning and laser shock wave cleaning are dry laser cleaning methods that have also been evaluated for particulate cleaning. Laser acoustic wave cleaning involves direct excitation to the substrate and therefore suffers from a high potential for substrate damage particularly for small particles as discussed. Laser shock wave cleaning has been shown to improve particulate removal and can reduce the risk of substrate damage by focusing the laser above the substrate surface and relying on the shock wave interaction with the particulates. This technique will also have increased difficulty when applied to small particle removal. In addition, the shock wave may damage other sensitive features on or near the surface of the substrate. This is particularly true if there is a sensitive material above the substrate surface, since generating the shock wave requires relatively high laser intensity focused above the substrate.

Even the newest dry laser techniques can also be limited in cases where access to the environment above the surface is not practical (e.g., enclosed systems). The removal process will only move the particle to a different location on the substrate for an enclosed system, because the particles are removed from the surface as a whole. Typically these techniques utilize additional control devices and methods to completely remove the particles from the substrate being cleaned. These methods include directed air flow, use of reduced pressure (vacuum) or gravity most of which require open access to the environment above the substrate surface.

Semiconductor manufacturing is one of the major industrial areas that utilize surface cleaning processes including laser cleaning methods. Many of the required cleaning processes have a stringent tolerance on the allowable level of substrate damage. In addition, the small product features make it necessary to remove very small particles to avoid product failures. Cleaning is an issue in multiple wafer processing steps and includes extended contamination layer (e.g., resist removal) and particulate contamination removal.

Surface cleaning is also a requirement for the optics (e.g., photomasks) used in the wafer manufacturing process. For photomasks in particular, a build up of contamination is observed during the normal usage of the masks in the wafer print processes. These masks are exposed to deep ultraviolet (DUV) radiation during the normal processing used in printing the mask pattern onto the wafer. Exposure to this radiation produces a contamination growth in the form of small particles that absorb the illuminating radiation. This growth is commonly referred to as haze.

Haze formation is a problem for the wafer print process because as the particles increase in size they block more of the light being transmitted through the photomask. Eventually the haze contamination absorbs enough of the light to cause defects in the printed image of the photomask on the wafer. Before the haze contamination reaches this level, the photomask surface must be cleaned. This cleaning requirement has the effect of decreasing the useable lifetime of a photomask because the processes currently used to remove haze deteriorate the absorbing film on the mask. For partial absorbing films, the current cleaning methods reduce the film thickness and therefore affect the films transmission and phase properties. Changes in phase and/or transmission reduce reticle lifetime by altering the size and shape of printed features on the wafer beyond acceptable tolerances. Duplicate sets of photomasks must be made in order to continue manufacturing once the useable life of a photomask is exceeded. Duplicate sets are also required for use while contaminated photomask are being cleaned. There can be a several day time requirement before the mask is cleaned and verified, since the cleaning processes are typically preformed at a different facility. As the required feature size for semiconductor manufacture decreases, the size of haze growth that will produce printed defects also decreases. This increased sensitivity to haze growth means that the newest photomasks will need to be cleaned more frequently and will have a shorter useable life.

Application of alternative cleaning methods to remove photomask surface haze contamination is hindered by the use of pellicles attached to the photomask surface(s). A pellicle consists of a frame that is adhesively bonded to the photomask surface and a thin membrane stretched across the pellicle frame. Pellicles are used to prevent externally generated particles from settling onto the surface of the photomask where they could affect the print process. Externally generated particles settle on the membrane above the mask surface where they have a significantly reduced affect on the print process. With the exception of a small filter valve on the pellicle frame to allow for pressure equalization, the top surface of the photomask is effectively sealed from the local environment by the pellicle attachment.

The current accepted method for haze removal requires the wafer manufacturer to ship the contaminated photomask back to the mask maker or to a third party. Here the pellicle frame is removed from the photomask, the mask is cleaned, inspected for defects and a new pellicle is attached to the photomask and in many cases the mask is inspected again for particle defects before it is shipped back to the wafer manufacturer. This typically takes days to complete, increases the photomask cost due to the additional processing and degrades the photomask quality due to the cleaning process. Additionally, there is a small probability, usually due to the adhesive from the pellicle being removed and falling onto printable areas of the photomask, that the mask will be damaged beyond use by the haze removal process.

Current efforts to improve the issues related to haze growth on photomasks have focused on processes that can be implemented before the pellicle is added because of the difficulties related to through pellicle cleaning. These efforts have been primarily focused on surface preparation and use of alternate chemicals in the cleaning processes. The latter has been shown to change the haze contamination species but not eliminate their growth. Both areas, at best, show a reduction in the growth rate and do not eliminate the requirement for cleaning. More recently, use of an inert environment has been shown to decrease the growth rate of haze formation on photomasks. Application of this method requires control of all environments the photomask is exposed to including all process equipment. As with other methods being developed, this process has the potential to reduce the growth rate but not eliminate the requirement for and the detrimental effects of cleaning.

SUMMARY OF THE INVENTION

At least in view of the above discussion, it would be advantageous to develop an alternative cleaning method and/or apparatus for removing haze contamination from a photomask surface that avoids the detrimental effects of the current cleaning processes.

It would be additionally advantageous to develop a novel laser based cleaning method and/or apparatus for removing haze contamination from a photomask surface without pellicle removal, because of the limited applicability of demonstrated laser based cleaning methods.

It would be additionally advantageous to integrate methods and/or apparatuses for removing haze contamination from a photomask surface into a wafer fabrication process.

It would be additionally advantageous to develop a method and/or apparatus for removing haze contamination from a photomask surface that is minimally dependent or independent of particle/contamination size.

It would be additionally advantageous to develop a method and/or apparatus for removing haze contamination from a photomask that would produce minimal or no substrate and absorbing film material changes and result in an extended lifetime of the photomask.

It would be additionally advantageous to develop a method and/or apparatus to extend the lifetime of a photomask by modifying or altering the phase of a partial absorbing film on the photomask.

It would be additionally advantageous to develop a method that would mitigate haze re-growth or reformation.

The foregoing needs are met, to a great extent, by certain embodiments of the present invention that provide methods for cleaning a surface of a substrate and for increasing the useable lifetime of a photomask substrate. In an embodiment, a substrate has at least one radiation-produced particle disposed thereon, and a laser that has a wavelength that substantially coincides with a high absorption coefficient of the substrate is directed towards the substrate. A thermal increase is generated in the substrate, and the radiation-produced particle is removed from the substrate by transferring thermal energy from the substrate to the radiation-produced particle until the radiation-produced particle decomposes. In another embodiment, a photomask substrate has radiation-produced particle contamination, and electromagnetic radiation that has a wavelength that substantially coincides with a high absorption coefficient of the photomask substrate is directed through a protective material towards the photomask substrate. A thermal increase is generated in the photomask substrate, and at least a portion of the radiation-produced particle contamination is removed by transferring thermal energy from the photomask substrate to the radiation-produced particle contamination until the radiation-produced particle contamination decomposes. In a further embodiment, a substrate has a contaminating particle layer disposed thereon, and a laser that has a wavelength that substantially coincides with a high absorption coefficient of the substrate is directed through a pellicle film towards the substrate. A thermal increase is generated in the substrate, and at least a portion of the contaminating particle layer is removed from the substrate by transferring thermal energy from the substrate to the contaminating particle layer until the contaminating particle layer portion decomposes.

According to another embodiment of the present invention, an apparatus for laser surface cleaning utilizing the above-described method is provided. The apparatus may include metrology for inspection of surface contamination and material property analysis before, during, and/or after the cleaning process.

The apparatus may also include components for controlling the temperature of the substrate and/or adjacent materials. These components may include, for example, local temperature control or overall temperature control.

According to yet another embodiment of the present invention, a wafer fabrication process utilizing the above-discussed method and/or the above-discussed apparatus is provided for cleaning of contaminated photomask surfaces. The fabrication process may include performing the cleaning steps within the wafer fabrication facility. According to certain embodiments the use of a duplicate photomask in the wafer fabrication process is not required while the original photomask undergoes the dry laser cleaning cycle.

Certain embodiments of the present invention provide the ability to clean surfaces without surface preparation or environmental control above substrate surface. Certain embodiments provide dry laser surface cleaning processes with reduced risk of substrate damage. Also, certain embodiments provide for minimal dependence on contamination size and/or the ability to clean a photomask surface without pellicle removal. Further, certain embodiments of the present invention reduced photomask cleaning time and/or provide for an extended lifetime of photomasks used in wafer printing. In addition, certain embodiments of the present invention reduce wafer manufacturing costs including reduced number of duplicate photomasks and/or reduce downtime during wafer manufacturing.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

Attached are a plurality of figures that illustrate various embodiments of the present invention.

DETAILED DESCRIPTION

Figure 1A:
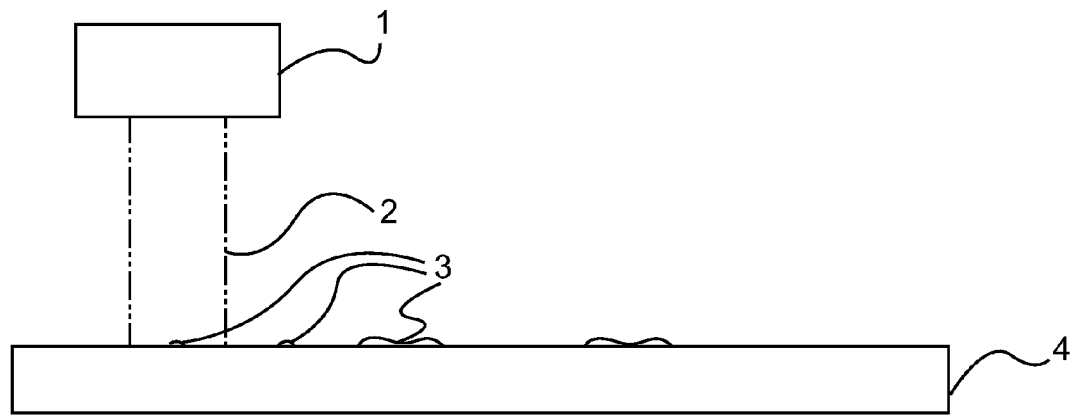
FIG. 1a illustrates a schematic diagram of laser excitation and surface contamination.

The invention will now be described with reference to the drawing figures, in which like reference numerals refer to like parts throughout. According to certain embodiments of the present invention, a method for laser surface cleaning with a reduced risk of substrate damage is provided.

Figure 1B:
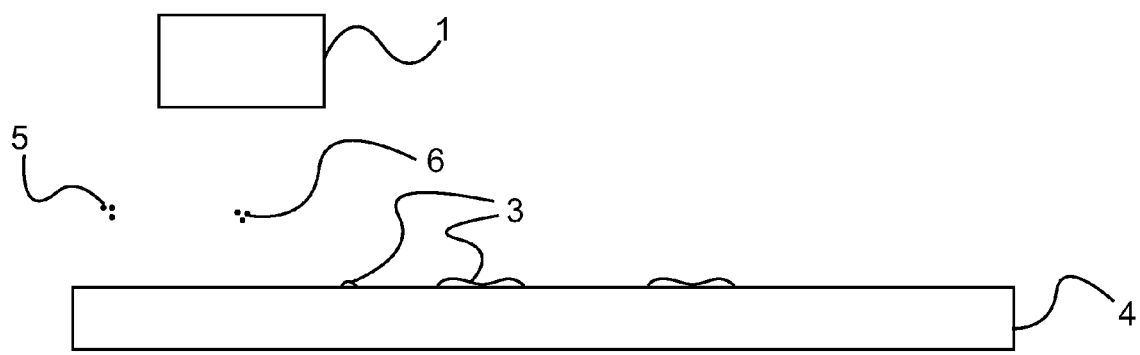
FIG. 1b illustrates a schematic diagram of substrate surface illustrating contamination removal. According to certain embodiments of the present invention, multiple species may be removed from the mask and these species may be in the form of a gas, liquid, solid, etc.
Figure 2:
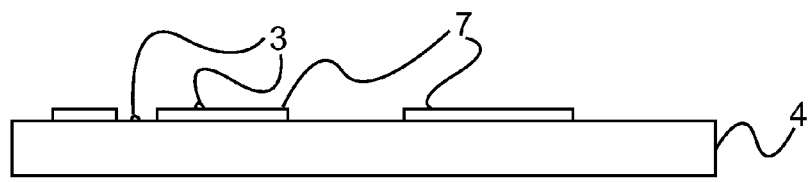
FIG. 2 illustrates a diagram of a photomask surface with thin film absorber on top including contamination on the film and on the substrate.

FIG. 1A illustrates an embodiment of the present invention in which an excitation energy 2 comes from an energy source, such as a laser 1 and is directed towards the contaminated substrate's 4 surface resulting in thermal transfer from the substrate's 4 surface to the contaminating particulate 3 or contamination layer (e.g., by convection or conduction). However, energy sources other than laser may also be used (e.g., lamps and other devices that can radiate energy all along the electromagnetic spectrum may be used, including generators or x-rays, microwaves, infrared radiation, near-ultraviolet radiation, etc.). Also, the surface may be of any material (e.g., the surface of a silicon wafer). The resulting temperature increase in the contamination typically produces a thermally based removal and its effects are shown in FIG. 1B, including but not limited to sublimation or vaporization materials 6 and decomposition materials 5. Additionally, the contaminating particulate 3 can be found on photomask as illustrated in FIG. 2, which shows contaminating particulates 3 on substrate 4 and on a thin film absorber 7.

According to certain embodiments of the present invention, the method has a reduced risk of substrate damage because the temperature typically used to produce surface cleaning is below the thermal damage level of the substrate 4 material(s) 4. The risk of substrate damage is also typically reduced over other techniques because it can, in some instances, utilize relatively long pulse-widths which often reduce the potential for multi-photon absorption processes.

The above-discussed exemplary method generally provides for improved removal of small contaminants/particles because it has a minimal dependence on particle size. The method may be particularly advantageous for applications where the environment above the contaminated substrate is substantially or fully enclosed. In these cases, the method may also include directing the beam through a material disposed relative to the surface that is part of the substrates environmental enclosure. For example, the inventive method could be used to clean haze contamination from the surface of a pellicalized photomask.

It has been suggested that decomposition of a contaminant species could be an advantage in a laser surface cleaning process. However, before embodiments of the present invention were developed, there had been no disclosure of a process that utilizes laser heating of a substrate to produce thermally based surface cleaning.

According to certain embodiments of the present invention, the method includes selecting a laser wavelength that substantially coincides with a strong absorption of the substrate and setting the laser energy and pulse width to produce the desired cleaning effect. Increased absorption in the substrate, in some instances, allows lower laser energies for the cleaning process. Therefore decreasing the potential for damage to adjacent materials that may interact with the laser as it is directed to or reflected from the surface. Although not a requirement, according to certain embodiments of the present invention, a wavelength is selected that is also highly absorbed by the contaminant or contaminants, since this may improve the desired thermal removal effect. The use of multiple laser wavelengths and/or laser energies may be used in the cleaning process, particularly when the substrate consists of more than one material. Multiple laser energies may also be used for the same component, typically if it undergoes a material or material properties change during a first step of the desired cleaning process. Multiple wavelengths may be produced, for example, by utilizing multiple laser sources or a single tunable laser source or both. Multiple energies can be used by control of the laser source(s) output energy using controls internal or external to the laser(s).

Practical Example

The following is an example of a method according to one embodiment of the present invention applied to surface cleaning of haze contamination from photomask substrates used in wafer fabrication processes. This example may be used throughout the additional embodiments of the inventive method discussed.

Certain embodiments of the present invention are applicable to the surface cleaning of wafers (e.g., silicon wafers). A type of haze growth has also been observed for these substrates and can become an issue in some instances if it is not removed prior to wafer printing. Use of environmental control has been suggested for the control of haze growth on silicon wafers. However, certain embodiments of the present invention are for haze mitigation or other types of contamination removal on surfaces, for example, silicon wafers. More specifically, according to certain embodiments of the present invention, by laser exciting the silicon wafer substrates below the thermal damage threshold it is possible to remove the haze.

Methods according to certain embodiments of the present invention can clean contamination precursor materials, because such methods typically do not rely on a direct absorption of the material disposed on the substrate. In this way, a method according to certain embodiments of the present invention may act as a surface preparation technique that reduces the rate of contamination formation. Photomask haze growth, for example, can be reduced by applying a method according to the present invention prior to use in the wafer fabrication process and removing or relocating haze growth precursor materials (e.g., acid residue, water, etc.) or nucleation sites. Other techniques could be used in conjunction with the current invention to further mitigate regrowth or reformation of haze after the reticle is processed with the present invention. For example, surface preparation prior to pelliclization or environmental control prior to, during, or after processing could increase reticle lifetime by reducing the haze regrowth or reformation rate.

Application of methods according to certain embodiments of the present invention to a substrate consisting of multiple materials may require consideration of the material parameters as well as the beam parameters, including excitation wavelength selection. The basis of the cleaning process makes it particularly desirable for all contaminated areas of a substrate to reach a temperature substantially near that typically needed for removal without exceeding the thermal damage threshold of the substrate. It is possible that the laser energy typically required to bring one of the materials to process temperature will produce thermal damage in the other material, particularly if there is a significant discrepancy between the material absorptions. The local fluence of the beam may be controlled based on the materials being exposed.

According to certain embodiments of the present invention, longer laser pulse widths, up to and including continuous wave (CW) lasers, are used to improve the thermal equilibrium between materials with significantly different absorption constants. However, the use of such longer laser pulse widths produce the highest thermal increase in the system and may not be useable if a material adjacent to the substrate surface has a thermal damage threshold below the process temperature.

According to certain embodiments of the present invention, a laser wavelength that has a significant absorption in all of the materials on the substrate is selected. The same laser energy can then, for example, be used to produce the desired process temperature below any of the substrate materials damage thresholds. By considering the thermal properties (including diffusivity) it is possible to take advantage of the thermal transfer between the different materials. This, in some cases, allows the use of a reduced process fluence to achieve removal on the entire substrate, particularly if the thermal energy flow from a higher absorbing material is preferential to the lower absorbing material.

Control of the beam parameters is particularly desirable in the embodiments of the invention related to photomask surface cleaning of haze contamination. Wavelength selection, for example, is highly desirable because of the physical structure of the typical photomask. Referring to FIG. 2, a photomask usually consists of a quartz substrate 4 with a thin absorbing film 7 on the critical surface. In the case of a metal film, there will typically be a significant absorption coefficient for the majority of producible laser wavelengths. For the quartz substrate, however, there will generally be a limited wavelength range where the substrate has significant absorption and laser sources are commonly available. Considering the thermal properties of the quartz versus the metal layer, certain processes according to embodiments of the present invention would utilize a wavelength that is highly absorbed by the quartz substrate material because thermal transfer between the materials will occur preferentially from quartz to the metal layer.

The above discussion is also generally true for the case of partial absorbing photomask films. In general, thermal flow for photomasks with partially absorbing films will occur preferentially from the quartz to the film, since the films typically contain a metal component and quartz has a relatively low thermal diffusivity. However, there may be wavelength regions where these films do not significantly absorb unlike for pure metal films. This has the potential for increasing the range of wavelengths that could be used to preferentially excite the quartz sections of the substrate. In addition to thermal flow, thermally induce material changes (e.g. Oxidation, annealing, etc.) must be considered for partial absorbing films. The phase and transmission characteristics of these materials are critical to their functioning and may be altered by thermal processing. If a thermal material change produces an adverse affect to the film performance, it may be necessary to limit the maximum temperature of the removal process. If a thermal material change produces an advantageous affect it may be necessary to control the process uniformity by pulse shaping or pulse overlap.

A specific example of a representative method according to the present invention is the removal of ammonium sulfate haze from the surface of a photomask. Temperatures and other regions—Ammonium sulfate is expected to decompose at temperatures above 280° C. The lowest thermal damage point for a typical photomask will typically be the melting/reflow point for the base quartz substrate (i.e., around 1600° C.). Therefore, there is a potential process where the temperature for contamination removal/cleaning can occur that is below the damage level of the substrate materials.

It is important to note that the exact species being removed from the photomask typically only determines the process temperature requirements. Although it may be advantageous to have a significant absorption in the contamination, it is not a requirement. As discussed above, the relative absorption of the substrate materials is generally considered because of potential differences in the material absorption characteristics. In particular, it would be desirable that the quartz substrate have a significant absorption at the process wavelength primarily because the thermal flow will be preferential to the absorbing films.

Figure 3:
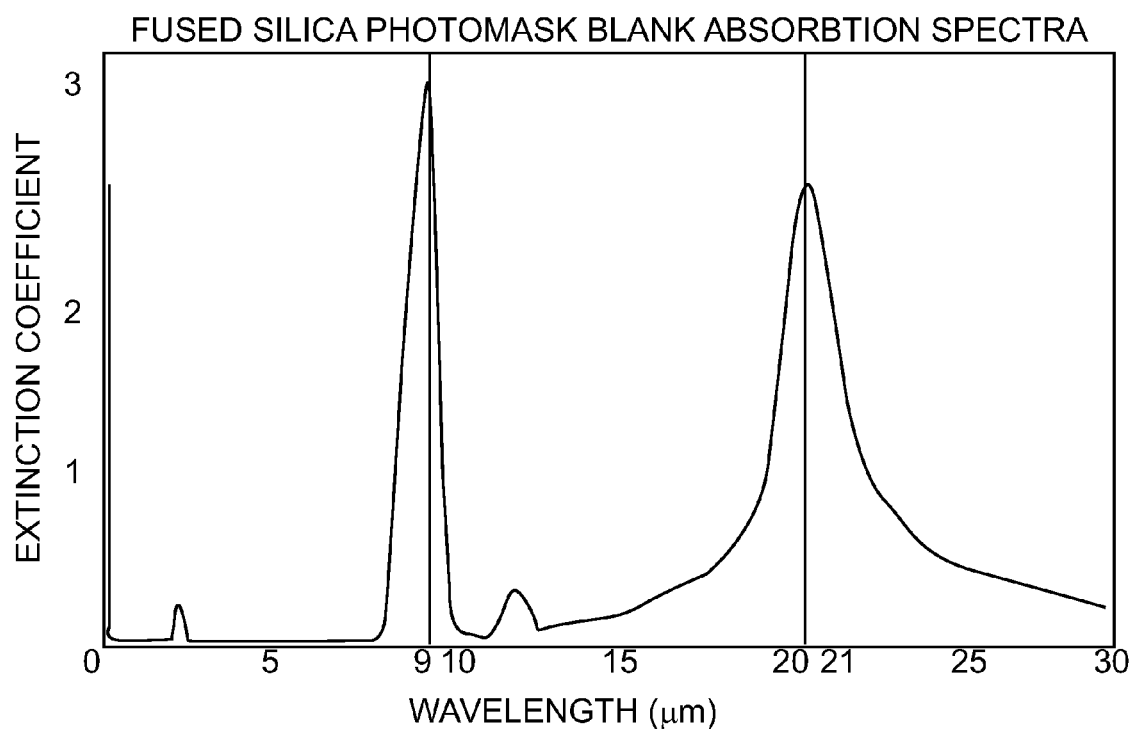
FIG. 3 illustrates a plot of a quartz absorption spectrum from the deep ultraviolet to the far infrared region of the electromagnetic spectrum.

Quartz substrates used for photomasks are typically specifically designed to have high transmission in the deep ultraviolet (DUV) wavelength range as show in the quartz absorption spectrum in FIG. 3. This is typically accomplished by using synthetically formed substrates that have an extremely low level of impurities. With the exception of a relatively weak absorption near 3 µm wavelength, these materials typically have high transmission in the infrared region as well. The main absorption for these substrates generally occurs either below 0.2 µm wavelength or above 8 µm wavelength. The shorter wavelengths are not in a particularly desirable wavelength range, because they are usually significantly absorbed by air and because they have higher photon energy and are more likely to produce multiphoton processes.

Selecting a wavelength above 8 µm, for example near the 9 µm quartz absorption, is particularly desirable according to certain embodiments of the present invention. This typically produces a high absorption in the quartz substrate without high environmental absorption. Particularly if the photomask has a metal film layer (e.g., chrome), this wavelength has an additional benefit because the reflectivity of the metal film increases with increasing wavelength in this region. This typically reduces the light available to be absorbed by the film and generally improves the bias of the thermal excitation to the quartz. This wavelength may also provide an advantage for photomasks that have a partially absorbing film coating (i.e. MoSi) because the relatively high absorption coefficient for quartz. Generally, the film material temperature reached at constant fluence should be similar to that for quartz because of the high quartz absorption and the higher thermal diffusivity of the partial absorber compared to quartz. This is expected to be true even if the partially absorbing film has a relatively high absorption coefficient in this wavelength range.

The process just described for use according to certain embodiments of the present invention typically increases the useable lifetime of a photomask by replacing the current cleaning processes used to remove haze from photomask surfaces. Unlike the typical chemical clean processes used for haze cleaning, the laser removal process according to certain embodiments of the present invention, does not generally decrease the absorber thickness and/or line widths of the absorber film. There is a limit to the number of conventional "clean processes" that can be performed before the photomask will no longer be useable, since material loss is a consequence of these processes. This is particularly true for photomasks with partially absorbing films, because the loss of material results in a loss of phase and an increase in transmission through the film. By design, the performance of partially absorbing film photomasks is critically dependent on the phase and transmission of the film. It is possible that an unlimited number of cleaning cycles could be used with the laser clean process according to the present invention.

It has been determined that employing temperatures below a critical range can produce a material change in a partially absorbing film. For example, a partially absorbing MoSi film anneals at a first temperature and the affect of annealing the film is a reduction in the phase delay of the light transmitted through the film or a significant loss in transmission, it will be necessary operate the cleaning process below this first temperature. Otherwise, the lifetime of the partially absorbing film photomask will be reduced as it is with the nominal wet "clean process" currently used for haze removal. However, the temperature of the process of the current invention can be finely controlled by adjusting the energy provided to the surface (e.g. Controlling pulse duration, pulse amplitude, CW energy, etc.) and thereby circumvent the film's critical temperature tolerances.

However, if the affect of annealing the film is an increase in the phase delay of the light transmitted through the film and minimal or no loss in transmission, operating the clean process above the annealing temperature could be advantageous. Standard wet "clean processes" are integral to the production of photomasks and can produce an unacceptable low phase delay for partial absorbing films even prior to use. In addition, it is possible that wet clean processing will be required in addition to use of the current invention. For example, a wet clean process may be required if non haze related defects exist or appear on the photomask. Producing a material change in a partial absorbing film during the inventive clean process could extend the lifetime of the photomask, by recovering phase delay lost by wet cleaning processing. It is also possible that thermal modification to a partial absorbing film, using the inventive method, could by itself (without requirement for haze cleaning) extend the lifetime of a photomask reticle by recovering phase lost during wet clean processing.

One of the reasons that aggressive wet clean processes are used is the fact that removal of the pellicle frame from the photomask leaves an adhesive residue. Wet clean processes in general will affect the adhesive residue causing the adhesive to contaminate working areas of the mask, because they are generally difficult to localize. Some of the laser clean processes disclosed herein, however, can be localized away from the adhesive residues leaving them unaffected. A controlled removal of the pellicle frame and majority of adhesive followed by a laser clean process according to an embodiment of the present invention allows a subsequent pellicle attachment without a wet clean requirement (aggressive or otherwise). This is particularly true if the laser clean process according to an embodiment of the present invention is combined with the use of a multiple part pellicle that would utilize an alternative bonding method or would not require exposure of the adhesive for pellicle exchange.

Figure 4:
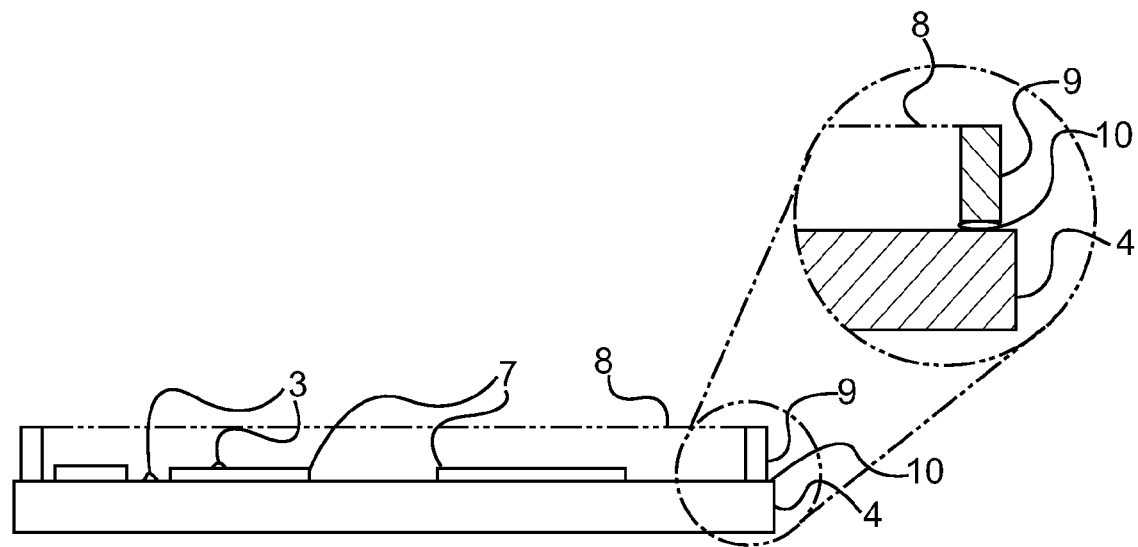
FIG. 4 illustrates a diagram of a photomask surface with thin film absorber including pellicle attached to surface. According to certain embodiments of the present invention, there can be contamination on the film and/or on the substrate.

Methods according to certain embodiments of the present invention may be applied to photomask haze cleaning and do not require removal of the pellicle. These laser cleaning methods are typically performed through the pellicle film material without affecting the pellicle film characteristics is illustrated in FIG. 4 showing a pellicle 8, a pellicle frame 9 and substrate pellicle adhesive 10.

In this case, the absorption of the pellicle film 8 at the process wavelength and the energy density (fluence) at the substrate's 4 surface is typically considered. As with the substrate 4 and the substrate film coating 7, the cleaning process generally does not produce a temperature increase in the pellicle film that is above the damage threshold. Depending on the pellicle film however, there may be significant absorption in the pellicle film near 9 µm absorption peaks for the quartz substrate. However, it is still possible to operate in a region of significant pellicle film absorption because the pellicle film is positioned above the substrate surface.

Figure 5A:
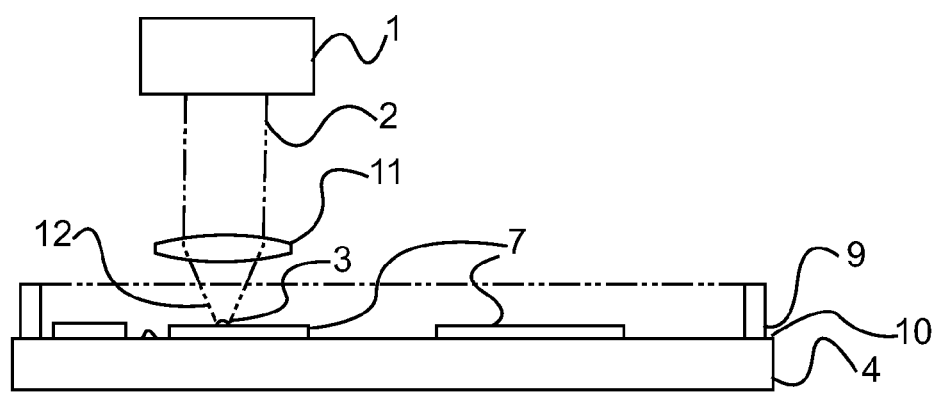
FIG. 5a illustrates a schematic diagram of a photomask with a pellicle showing a laser beam focused through the pellicle and onto a surface.

FIG. 5A illustrate focusing the excitation energy 2 through the focus lens 11 producing a converging beam 12 through the pellicle film onto the substrate film coating 7 located on substrate's 4 surface to remove contaminating particulates 3. Wavelength and convergence properties permit focusing at different elevations and can reduce the relative temperature increase in the pellicle film 8. The temperature increase in any substance is proportional to the fluence applied to the surface;

$$\Delta T \sim F \qquad \text{Equation 1}$$

where $\Delta T$ is the temperature change within the material and F is the absorbed laser fluence.

For a constant intensity or beam pulse energy, the fluence is inversely proportional to the square of the beam spot radius.

$$F \sim E/r^2 \qquad \text{Equation 2}$$

where F is the fluence, E is the energy and r is the radius of the beam on the substrate surface.

Figure 5B:
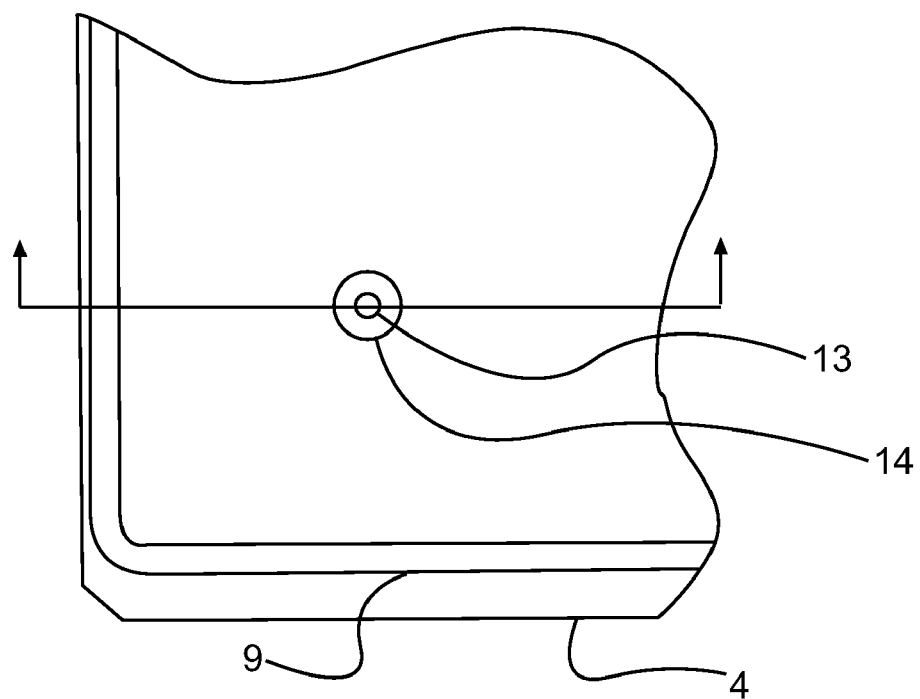
FIG. 5b illustrates a schematic diagram of the beam spot size on the pellicle versus on the mask produced by focusing.
Figure 5C:
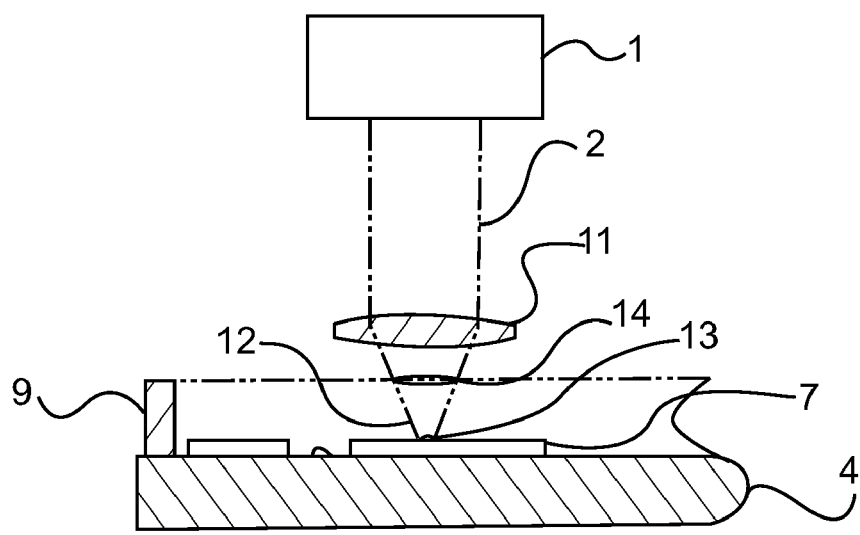
FIG. 5c illustrates a schematic diagram of a photomask with a pellicle showing laser beam focused through the pellicle and onto the surface and a side view of the beam spot on the pellicle.

FIG. 5B illustrates the spot beam size on a pellicle. The ratio of the beam radius at the pellicle (pellicle beam 14) to the beam radius on the mask surface 4 (mask beam 13) is typically increased by focusing the beam through the pellicle and, therefore, the relative fluence on the pellicle film compared to the photomask substrate surface can be reduced. FIG. 5C is a side view showing the convergence at the surface 4 at the mask beam 13 point versus the non-converged energy at the pellicle' 9 entry point (pellicle beam 14).

In addition to wavelength considerations, utilizing processes that produce a large temperature increase in the system (e.g., long pulse length or high repetition rate) may be limited by the damage threshold of the pellicle film. This is typically below the process temperature requirement for many photomask haze components.

Pulse Shaping

The pulse width, temporal pulse shape and the spatial distribution of the laser may be used to enhance the cleaning process or increase the safe operation range for processing according to certain embodiments of the present invention. Shorter pulse widths can be used to minimize the overall thermal input to the system (substrate and contamination). Longer pulse widths can be used to maintain the process temperature for an extended period of time enhancing the completeness of the thermal removal process. The temporal pulse shape can be used to control the temperature rise within the contaminating species. A long temperature rise can be used to produce an initial effect (e.g., melting) that would be followed by a secondary effect (e.g., decomposition). A shorter rise time can, in some instances, enhance vaporization of the contaminant while limiting the decomposition processes. Combinations of short and long temporal pulse shape can also be used to optimize the removal process. The use of multiple pulses can also be used to lower the beam energy that is desirable for complete cleaning, thereby further decreasing the risk of substrate damage.

Figure 6A:
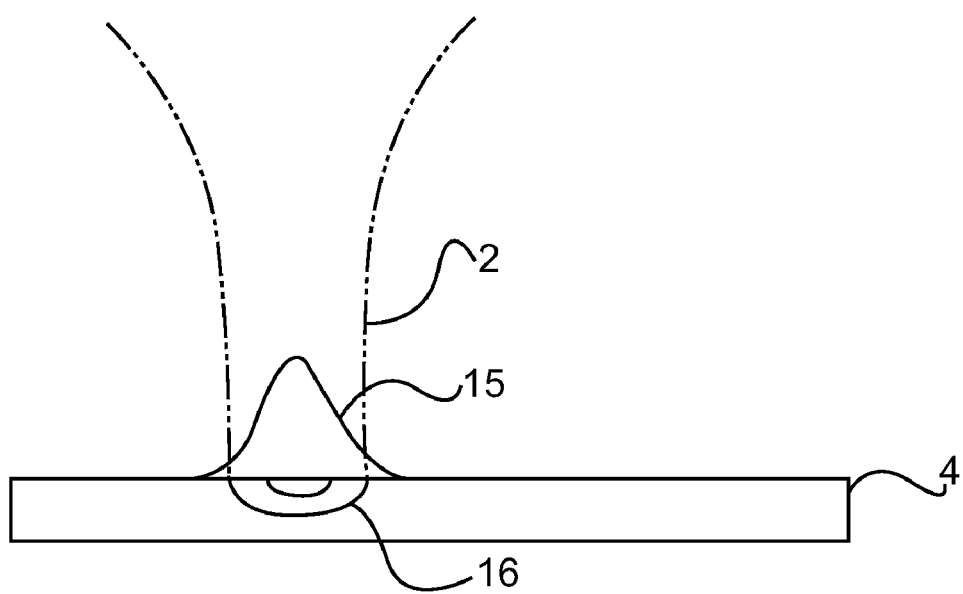
FIG. 6a illustrates a cross sectional view of a gaussian beam energy distribution and the corresponding temperature profile produced.
Figure 6B:
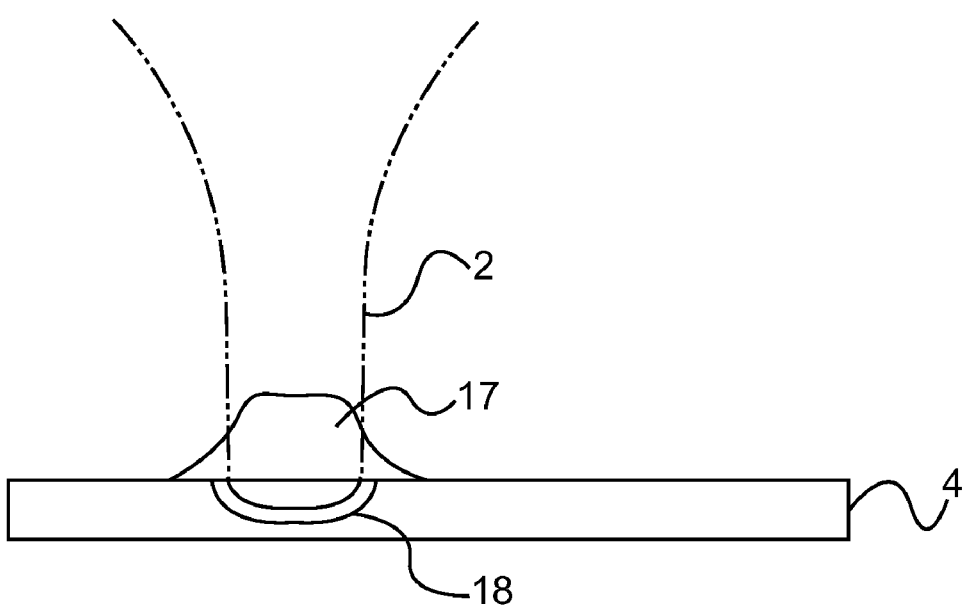
FIG. 6b illustrates a cross sectional view of a top-hat beam energy distribution and the corresponding temperature profile produced. According to certain embodiments of the present invention, gaussian, flat top, and/or top hat energy distributions may be used.

The spatial distribution of the laser beam can be used to increase the process window. For example, FIG. 6A shows a typical Gaussian spatial distribution 15, that may produce a temperature gradient in the substrate 16 while FIG. 6B illustrates a flat top or top hat spatial distribution 17 allowing for a more uniform temperature rise within the substrate 4. The spatial distribution can be used to increase the process window. For example, having a flat top or top hat spatial distribution allows for a uniform temperature rise within the beam spot, whereas a Gaussian distribution typically produces a temperature gradient within the beam spot In order to avoid risk of substrate damage, the maximum energy in the beam is typically limited by the peak of a Gaussian distribution. As described above, when more than one material exists on the substrate, longer pulse widths may be used to allow for thermal equilibration between substrate materials.

Thermal Management

Because certain embodiments of the present invention involve a thermal based process, it is sometimes desirable to manage the overall temperature of the system to avoid damage to thermally sensitive or easily contaminated materials. This is particularly true in the case of photomask haze cleaning without pellicle removal. The pellicle films typically have a low thermal damage threshold. Therefore, it is sometimes useful to avoid an overall system temperature build up that may transfer to and/or damage the pellicle material. This includes the pellicle frame and the enclosed environment between the mask surface and the pellicle film.

Figure 7:
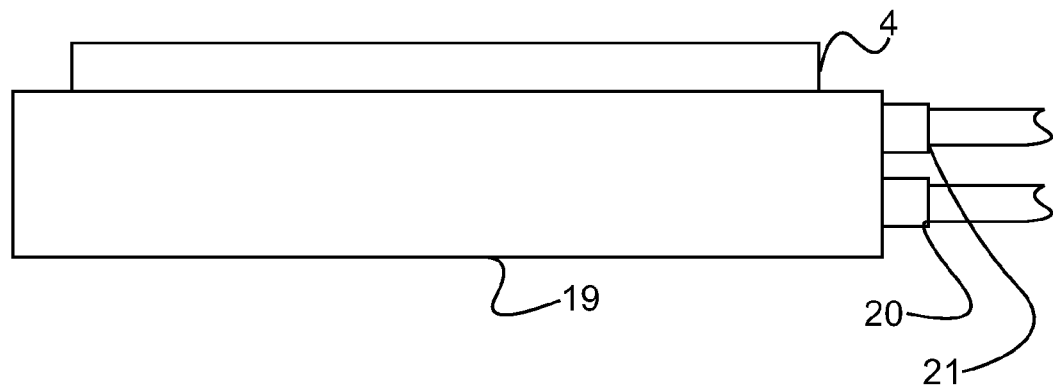
FIG. 7 illustrates a diagram of a photomask with a cold plate contacting bottom of the mask. According to certain embodiments of the present invention, the contact point could be, for example, either water (or other liquid or gas) flow through the cold plate or electrical contact for thermoelectric cooling.

Managing the system temperature can be accomplished in several ways. The following examples illustrate several representative methods of sample cooling and it is understood that other methods may exist. One way to manage the system temperature is through contact cooling. The photomask, for example, may be placed in contact with a plate 17 that acts as a heat sink to draw the heat generated on the front surface of the mask toward the back of the mask is illustrated in FIG. 7 and include heat exchange pipes 18 and 19. This reduces the heat transfer to the environment above the mask surface, the pellicle film and the adhesive between the pellicle frame and the mask surface. The cooling can be accomplished in a variety of ways, including flowing water or other cooling fluids or gases over the mask and/or pellicle, thermoelectric cooling or laser induced cooling of a portion or the entirety of the mask and/or pellicle.

Another potential way to control temperature is through forced convection cooling. Filtered and/or cooled gas or liquid flow is typically directed onto portions of the mask, onto the pellicle film, frame and/or adhesives areas to directly reduce the thermal build up in these materials, shown in FIG. 8. A top flow 20, side flow 21 or a bottom flow 22 of coolant can be utilized to control temperature. This typically does not only reduce the risk of pellicle film damage but also typically reduces the risk of creating contaminating out-gassing from the pellicle frame and pellicle film adhesives. In addition to hardware control of the system thermal buildup, it is possible to reduce thermal build up by allowing for an increased process time. Applying a slower rate of pulses to the system or allowing a delay between a series of pulse application can allow the injected heat to be removed without the total system temperature rising above a critical level.

Figure 9A:
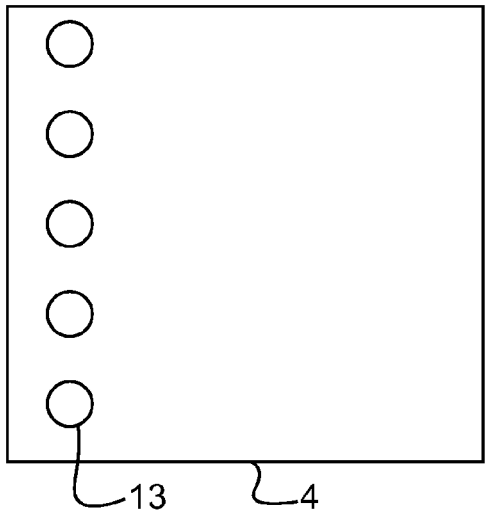
FIG. 9a illustrates a diagram showing a single pass of the laser beam across surface to minimize local thermal build up. A single row or column with large lateral spacing between spots is illustrated.
Figure 9B:
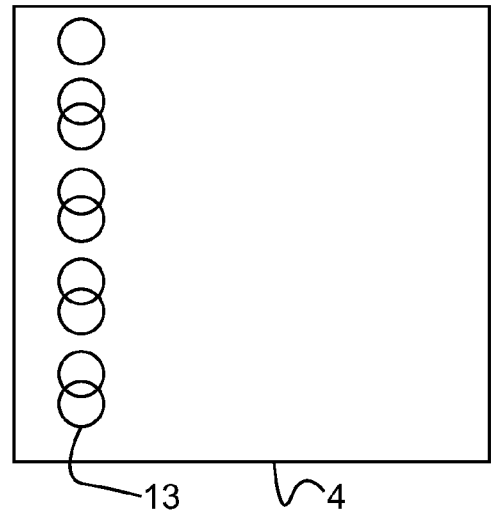
FIG. 9b illustrates a diagram showing two passes of the laser beam across surface to minimize local thermal build up. A single row with two sets of beam spots overlapped with large spacing between sets of pulses is illustrated.
Figure 9C:
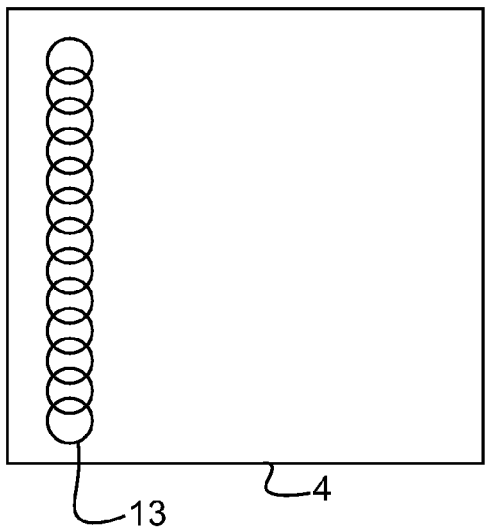
FIG. 9c illustrates a diagram showing multiple laser passes over an area of the substrate to achieve complete cleaning of the section of the substrate.
Figure 9D:
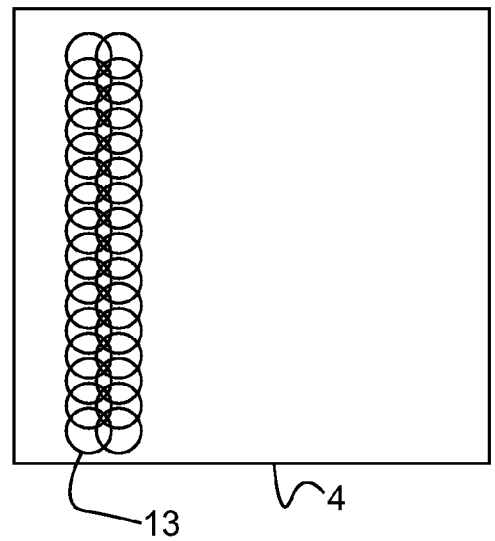
FIG. 9d illustrates a diagram illustrating a second dimension of surface cleaning.
Figure 9E:
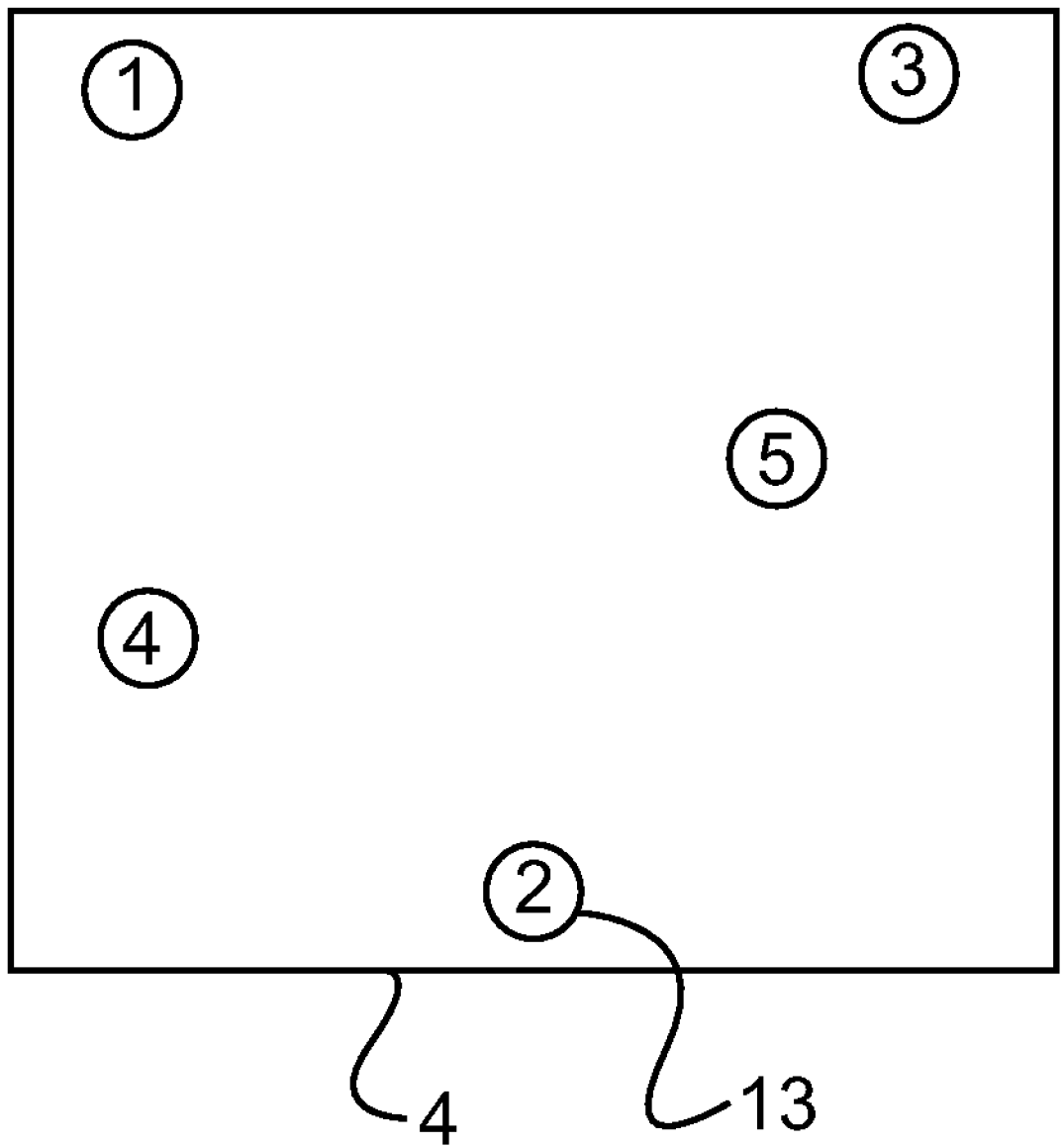
FIG. 9e illustrates a diagram representing the use of non-contiguous pulses on the surface

Pulse to pulse thermal build up may also advantageously be controlled and may depend on the thermal characteristics of the contamination, substrate and/or adjacent materials. In general, pulse to pulse thermal build up can be controlled by reducing the number of laser pulses hitting the surface per unit time. This temperature build up can also be controlled by increasing the distance between adjacent laser pulses. It may be particularly desirable to have a large lateral displacement between adjacent pulses, where the material is particularly sensitive to pulse-to-pulse thermal build (e.g., pellicle film materials). In this case, the process typically involves positioning the laser beam at nearly the same locations multiple times to obtain full cleaning of the target surface. For example, a first series of laser pulses 13 are exposed to the surface 4 with a relatively large lateral separation as shown in FIG. 9A. A second pass over the same area places an additional series of laser pulses 13 that are slightly shifted relative to the first set of spots as shown in FIG. 9B. This process continues until the entire area has been exposed to the laser pulses 13 as shown in FIG. 9B. Overlap in a second direction can be used, according to certain embodiments of the present invention, to completely expose a substrate surface 4 is illustrated in FIG. 9D. According to certain embodiments of the present invention, this overall process is repeated an/or the overlap between passes is increased, particularly if it is desirable for the cleaning process to include multiple pulses for complete removal. Changing the position of the beam relative to the surface as illustrated can be accomplished by moving the beam and/or moving the substrate. In addition, applying pulses in a more systematically distributed manner across the mask may reduce further the likelihood of heat buildup on the mask as illustrated in FIG. 9E.

Residue Control

Figure 8:
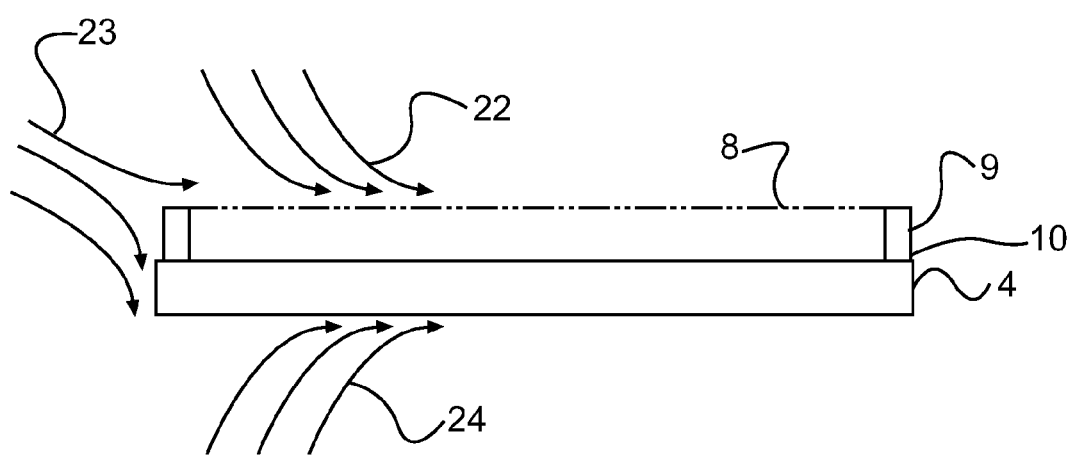
FIG. 8 illustrates a diagram showing force air cooling of areas on the photomask. According to certain embodiments of the present invention, airflow is directed at the pellicle frame.
Figure 10:
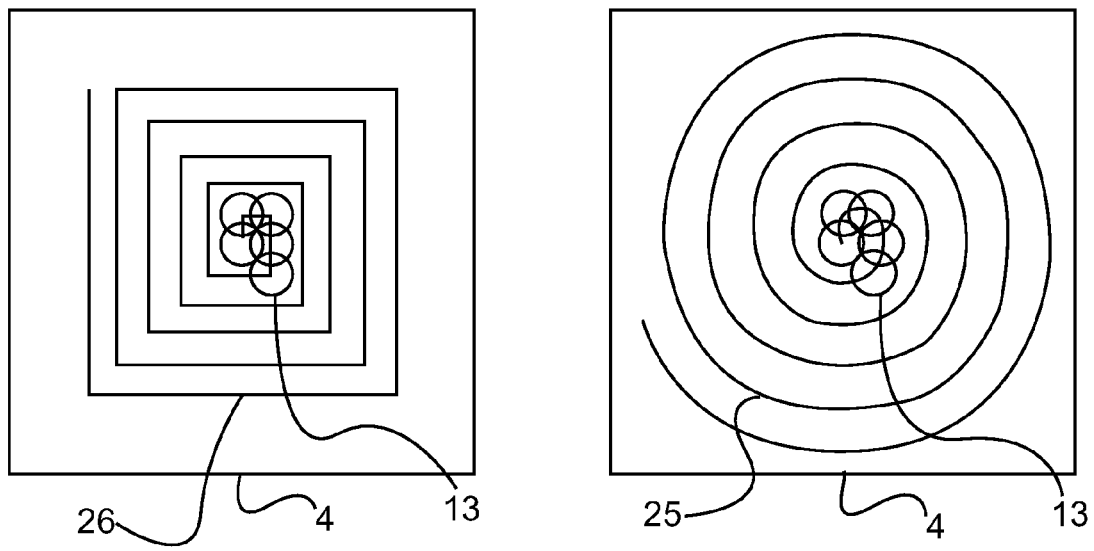
FIG. 10 illustrates a diagram illustrating the use of laser pulse pattern to control the location of residual materials.
Figure 11A:
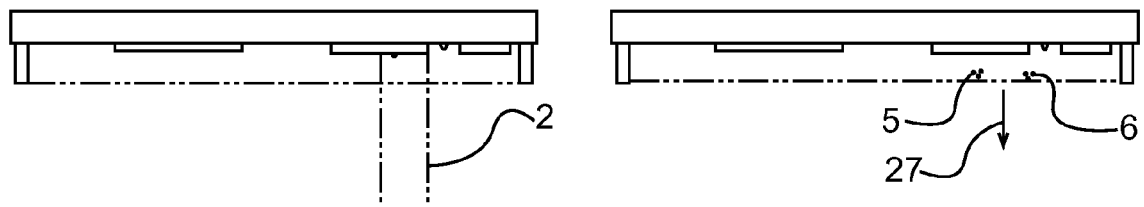
FIG. 11a illustrates a diagram illustrating the use of gravity to control the location of residual materials.
Figure 11B:
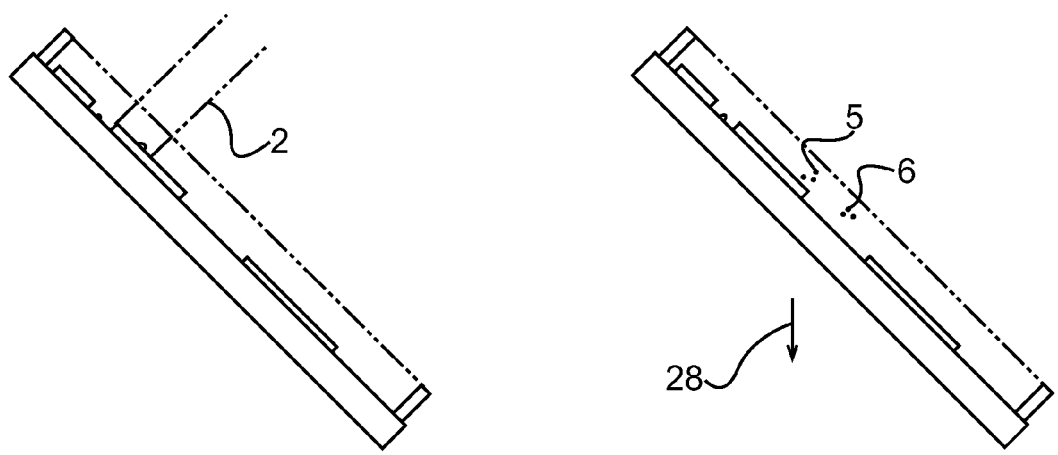
FIG. 11b illustrates a diagram illustrating the use of gravity to control the location of residual materials.

According to certain embodiments of the present invention, the laser cleaning method may produce residual materials on the photomask surface depending on the decomposition products of the contamination. Even if the residues no longer affect the use of the substrate material (i.e., even if the substrate is effectively cleaned), there may still be a reason to control their location or concentrations. Traditional methods for controlling residue formation such as, for example, applying a directed airflow, water flow or creating a reduced pressure over the substrate to be cleaned may be used according to certain embodiments of the present invention. However, for the case of an enclosed system, such as for example a pellicalized photomask, it is typically not desirable to use these environmental controls. As such, alternative methods for controlling the location of residual materials are used for a closed system according to certain embodiments of the present invention. For example, according to certain embodiments of the present invention, the pattern of laser pulses is controlled. For example, FIG. 10 shows an embodiments where the pattern of laser pulses 13 starts in the center of the substrate's 4 surface and is directed into an increasing diameter circular or increasing dimension square pattern 23, residual material will be preferentially moved toward the edges of the substrate as shown in FIG. 10. Another method according to certain embodiments of the present invention to control residue is to utilize gravity. Placing the photomask with the surface facing down is shown in FIG. 11A or tilted position 24 as illustrated in FIG. 11B, allowing for preferential deposit of residue materials on the pellicle film, or side of the photomask, respectively. In another method the reticle could be rotated (i.e. spun) in conjunction with certain embodiments of the present invention to cause residual materials to move away from the mask center and/or to non-active areas on the reticle. In addition, reducing the temperature of an area of the photomask, pellicle, pellicle frame according to certain embodiments of the present invention, creates preferential depositing of residue material to these surfaces, since this material is likely to be generated from a vapor phase transition to a liquid or solid as shown in FIG. 8. For example, these cooling methods could include but are not limited to flowing of water, other fluids or gases, thermal-electric cooling, or laser induced cooling in and/or around the preferred deposition areas.

Mitigation of Haze Growth and Reformation

The current invention could be used in conjunction with surface preparation or environmental control techniques to extend reticle lifetime. Some of these techniques will require processing before pellicle mounting while others can be performed post-pellicalization. For example, a surface preparation method in conjunction with the present invention prior to pellicilization could increase the time between cleanings. This could be important if there are a limited number of the inventive method cleans possible before additional cleaning (eg. Wet clean) is required. One embodiment of this inventive method is to place seed crystals or other nucleating materials beneath the pellicle in non-active areas of the reticle. These seed crystal may act as preferential growth sites for haze. This may effectively reduce the concentration of residues and precursor materials available to the active areas of the photomask and reduce growth rates in these areas. Another embodiment of this method is to coat the surface of the mask with a material that reacts with and/or neutralizes the residues and precursor materials liberated by the inventive cleaning process. This may also reduce haze growth rates in the active areas on the mask by limiting the available reactive species.

Post pellicle techniques could also be used in combination with the present invention. For example, environmental control or manipulation both inside and outside the pellicle could be used in combination with the present cleaning process invention. One embodiment would include exchanging the environment under the pellicle with a non-reactive gas after clean processing. This could be performed without pellicle removal by gas exchange through a filtered vent on the pellicle frame. It may be additionally advantageous to maintain an inert environment outside of the pellicle in conjunction with the present invention to mitigate haze re-growth or reformation. These combination processes could extend the time between clean processing with the inventive method and may be important if a limited number of clean processes can be used.

An additional post-pellicle, environmental control embodiment of the current invention would evacuate the environment under the pellicle and introduce or exchange the environment with a material that reacts with or neutralizes haze residues and/or precursors. This process could be performed before, during or after clean processing. In all cases, the haze residues and/or precursor species liberated during the clean process would react with the introduced/exchanged material to create a non-haze forming species.

Additional post pellicalization techniques could be used in conjunction with the present invention to mitigate haze re-growth or reformation. These techniques would utilize the thermal effects of the present invention to alter surface morphology and/or substrate composition to inhibit haze growth and reformation. For example, operating at or near the quartz reflow temperature may produce a change in the material state or morphology of the quartz substrate. This could reduce or eliminate the activation sites believed to cause nucleation of crystalline haze growth and thereby reduce the rate of haze growth or reformation. An alternative embodiment would combine surface preparation or environmental control method in combination with the thermal affect of the inventive method to modify or eliminate activation/nucleation sites. The precursor materials could be activated by thermal processing or could react with the surface under thermal excitation to reduce haze growth and reformation.

Metrology

Figure 12:
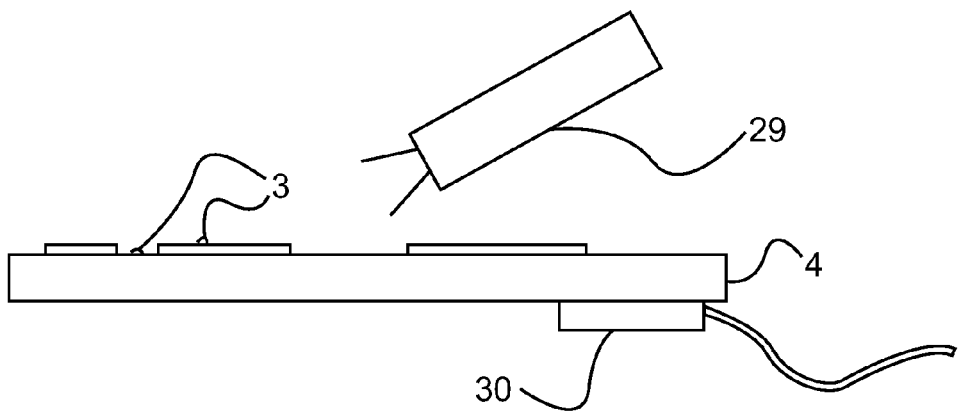
FIG. 12 illustrates a schematic diagram of contaminated substrate surface with thermocouple or infrared temperature monitoring devices.

Methods according to certain embodiments of the present invention may also be used in combination with metrology to monitor the critical process parameters and/or to evaluate the progression or completion of the cleaning process. Measurement of the locally generated temperature of the substrate materials can, for example, be used in combination with the cleaning process. Temperature measurement can be evaluated prior to application of the cleaning process in order to verify risk of temperature related damage. In addition, these temperatures may be monitored during the cleaning process to verify process control and/or reduce the risk of material damage. For example, according to certain embodiments of the present invention, the temperature of the substrate and/or absorber film is monitored during the process and has the ability to feed back control of the energy applied to maintain the desired process or turn off the cleaning process if too large a temperature build up is detected. Multiple methods of temperature monitoring exist are shown in FIG. 12 and include contact, for example, thermal-couple 26 and non-contact, for example, infrared camera 25 techniques.

Figure 13:
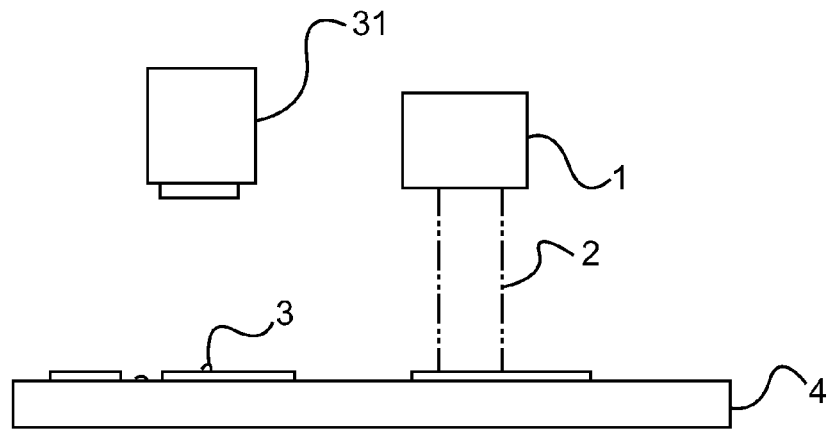
FIG. 13 illustrates a schematic diagram of contaminated substrate surface with imaging, microscopy, spectroscopy, or combination system for contamination analysis.

Metrology is also used, according to certain embodiments of the present invention, to analyze the contamination for material properties prior to, during and/or after the removal process, shown in FIG. 13. Identification of the contaminant prior to running the cleaning process may be used to set the ideal processing parameters. This allows use of the minimum process temperature, thereby reducing the risk of substrate damage. Monitoring the contamination during the process may also be used to assess the completion of the cleaning process based on the strength of the measurement signal as the cleaning process progresses. In addition, monitoring for alternative materials during the process may be used to signal when the process is creating a different contamination and/or causing an undesired change in the substrate material. This information may be used to control the process and/or to reduce the risk of substrate damage and/or a poor cleaning result.

Metrology is also used, according to certain embodiments of the present invention, to analyze or monitor the material properties of the substrate 4 and/or materials on or adjacent to the substrate prior to, during and/or after the removal process as shown in FIG. 13. For example, measurement of the material properties of a partial absorber film on the substrate can be used to calculate the phase delay of the material before processing. This could be used to determine the process temperature for cleaning in order to induce an appropriate phase delay in absorber film. This metrology could also be used to monitor the phase during processing and feedback information to the process or stop the processes if it is outside a process limit. Material property analysis of the substrate could be used to determine the correct energy to induce a desired surface material or morphology change. In addition, the material properties of the pellicle film could be monitored to determine if an adverse affect is occurring to the pellicle material. This information could be used before processing to limit process temperature, or during processing to stop the process if damage is observed. For example, one or more ellipsometers or cameras 31 could be used to measure the material response of the pellicle film, absorber film and substrate surface. This data can then be used to calculate the desired material properties including film thickness, transmission and phase.

Alternative metrologies to monitor the presence and amount of surface contamination can be used prior to, during and/or after the cleaning process according to certain embodiments of the present invention. For example, metrology used to detect the presence of contamination may be used according to certain embodiments of the present invention to determine whether or not to apply laser pulses to the region of the substrate that was measured. This information may then be used to minimize the number of pulses applied to the overall substrate which reduces the total thermal energy applied to the system as well as the overall cleaning process time.

Figure 14:
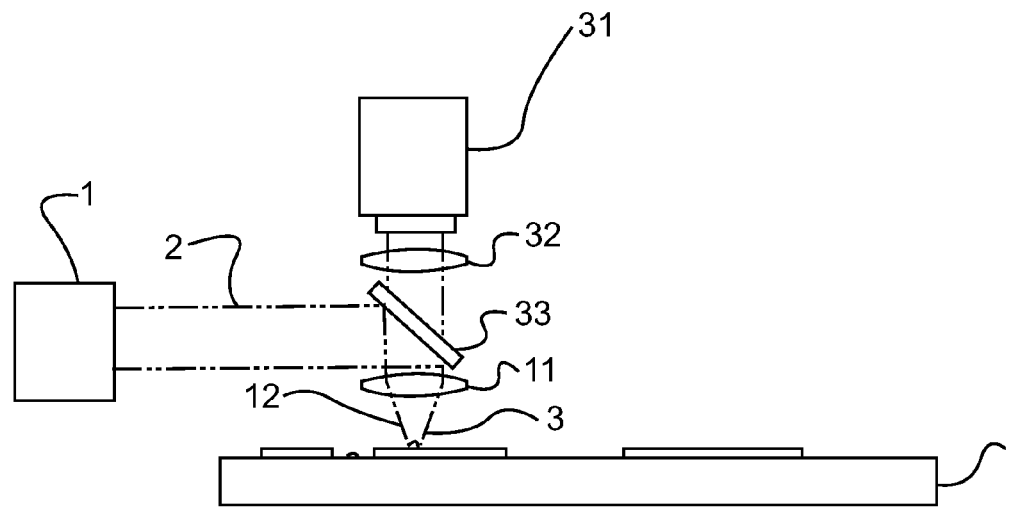
FIG. 14 illustrates a schematic diagram of a contaminated substrate surface with imaging system where the imaging system and laser beam delivery are common path.

Metrology to measure the lateral size/dimensions, location, number, density and/or height (thickness) of the contamination or contaminating particles can also be used, according to certain embodiments of the present invention, in combination with the cleaning process. These measurements can, for example, be used to qualify the efficiency and completion of the process by measurement before and/or after the cleaning process. During the process, these measurements can be used to evaluate the in-situ efficiency of the processes. For example, if multiple laser pulses are used for complete removal, detection of remaining contamination can be used to evaluate the number of pulses required for removal and if additional pulses are necessary. In this case, the metrology, according to certain embodiments of the present invention, is configured to view the area being cleaned while the cleaning process is occurring. This is typically done by imaging the area being exposed by the laser and can include the use of the same optics used for laser delivery as shown in FIG. 14. An imaging lens 32 allows detailed surveillance of the contaminating particulate 3 through a partially reflective mirror 29, permitting simultaneous monitoring and cleaning.

Multiple methods exist according to embodiments of the present invention for detection of particles and evaluation of particle dimensions. These methods include, for example, reflected and transmitted light intensity measurement, imaging, low angle scattered light detection, interferometry, scanning electron beam, scanning tunneling microscopy, near field microscopy, atomic force microscopy, etc. Multiple methods may be combined according to certain embodiments of the present invention to provide additional information.

In the case of a photomask, for example, multiple metrologies may be incorporated into the laser cleaning process according to certain embodiments of the present invention. Identifying the presence of a specific contamination (e.g., ammonium sulfate) on a photomask, for example, defines the decomposition temperature requirement and sometimes allows selection of laser energy just high enough to perform the cleaning process.

According to certain embodiments of the present invention, transmitted light intensity is measured and the result is compared with the programmed structure for the absorbing film on the photomask surface. Discrepancies between programmed features and detected features are then used to identify contamination. In addition, Aerial Imaging Measurement is used according to certain embodiments of the present invention to evaluate the print characteristics of the photomask. This method is typically used to evaluate the effect of contamination on the performance of the photomask. This measurement can also be used in-situ to detect damage to the absorber layer resulting from the clean process. This is particularly relevant for partially absorbing films in which the thickness of the film has a direct relationship to the photomask performance. According to certain embodiments of the present invention, combining scattered light detection with transmitted light detection improves identification of contamination by detecting irregular surface topography which would differ from the typically smooth surface of the photomask and photomask film.

Metrology is also used according to certain embodiments of the present invention to monitor the characteristics of materials adjacent to the surface being cleaned. For example, the temperature of a pellicle film above a photomask may be monitored to reduce the risk of pellicle film damage. The transmission characteristics of the pellicle film can also be used to qualify the affects of the cleaning process during or after the clean process. In addition, detection of particulates on the inside of the pellicle film may be made prior to performing the clean process and/or may be used to detect loss of these particles during the process and/or whether or not there should preferably be a limit of the energy used on the process to prevent the risk of pellicle and/or substrate material damage.

As will be appreciated by one of skill in the art upon practicing one or more embodiments of the present invention, the metrology examples discussed above are not intended to be all inclusive of the present invention. Rather, these examples merely illustrate the use of metrology within some methods according to the present invention.

Apparatus

Figure 15:
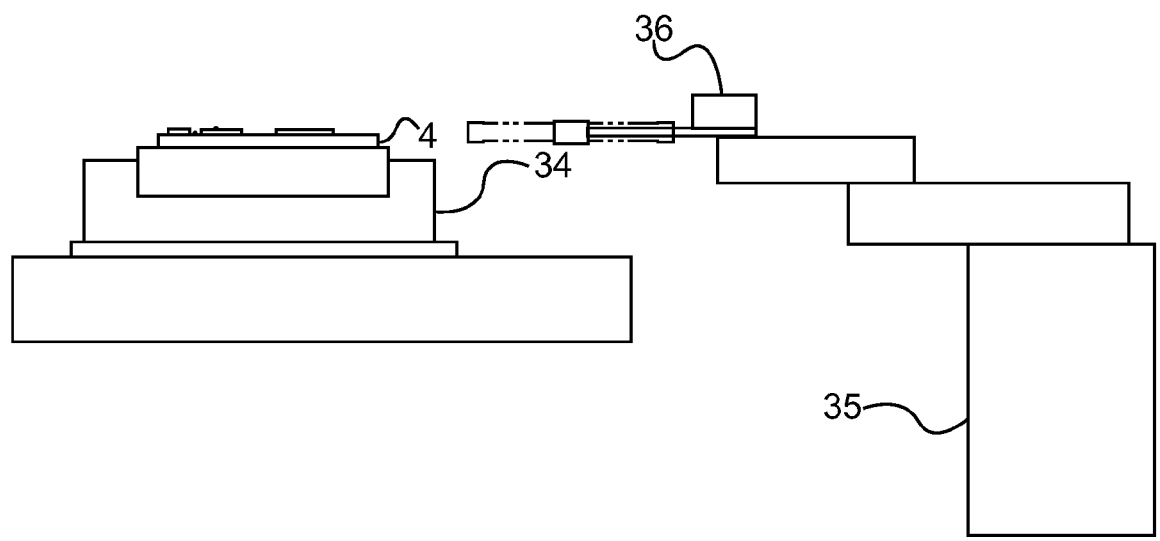
FIG. 15 illustrates a system diagram showing robotic load and X/Y/Z stage motion of substrate relative to laser beam.

Certain methods according to embodiments of the present invention are incorporated into apparatuses used to perform the laser surface cleaning process. An example of such an apparatus is shown in FIG. 15, additionally include a robot 35 for handling of the substrate material with a robot end effector to precisely position the substrate material and a platform 34, for one or more axes of motion to position the substrate sample relative to the laser beam. The apparatus may, for example, contain one or more of the metrologies as described above and/or may include ways of controlling the temperature of the substrate and/or adjacent materials during the cleaning process. In addition, the apparatus may include metrology used to register the substrate to the staging system and therefore to the laser beam. This metrology may also include computer controlled vision recognition systems. Further, the apparatus may also utilize computer control of the laser, motion and/or metrology and may provide for software based recipe control of the cleaning process. Laser control may, for example, include controlling when laser pulses are applied as well as the amount of energy applied during the cleaning process.

Wafer Fabrication Process

A method and/or apparatus according to certain embodiments of the present invention can be used as part of a novel wafer fabrication process that includes the removal of haze formation from a pellicalized photomask surface. Typically, photomasks are taken out of the wafer print process when the level of haze has become enough to adversely affect the wafer print process. The time before photomasks are taken out is typically determined either by direct detection of a high level of haze contamination or is based on a predetermined duration and/or level of use in the wafer process. Typically, the photomask is sent to a different facility to have the pellicle removed, photomask cleaned and another pellicle attached to the photomask. These other facilities (e.g., mask shops) maintain the equipment required to accomplish these tasks as well as to perform photomask repair and additional inspections not required at a wafer fabrication facility. Duplicate sets of photomasks are typically used during the time required to have the photomasks cleaned and a new pellicle attached. These additional photomasks add a significant cost to the overall wafer print process because of the high material and setup and evaluation costs required.

Figure 16A:
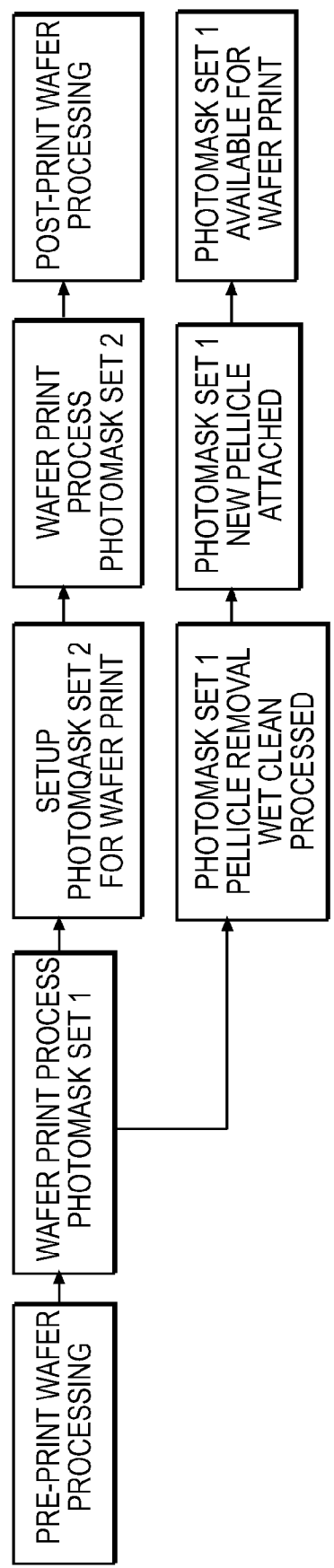
FIG. 16a illustrates a box diagram of typical wafer fabrication process utilizing photomask wet clean processing.
Figure 16B:
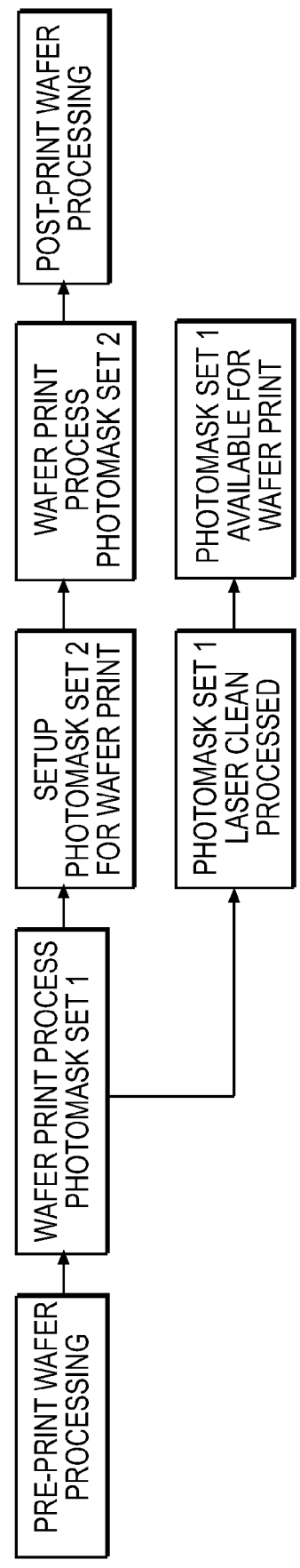
FIG. 16b illustrates a box diagram of a wafer fabrication process flow incorporating use of laser photomask cleaning without pellicle removal.

A novel wafer fabrication method according to certain embodiments of the present invention incorporates an apparatus utilizing one or more of the methods discussed above to clean a photomask surface of haze. A typical wafer fabrication process according to an embodiment of the present invention illustrates the use of wet clean processing to remove photomask contamination is shown in FIG. 16A. An alternative method also within the scope of certain embodiments of the present invention utilizes one or more of the laser cleaning methods described above to perform the cleaning operation at the wafer fabrication facility and without pellicle removal is shown in the flowchart FIG. 16B This can minimize or eliminate the additional pellicle costs and/or deterioration of the photomask film produced by the current wet clean processing.

Figure 16C:
FIG. 16c illustrates a box diagram of a wafer fabrication process flow incorporating use of laser photomask cleaning without the use of additional mask sets during the clean process.

According to certain embodiments of the present invention, a novel wafer fabrication process eliminates the use of additional masks or mask sets for product manufacture while the original set is being cleaned. In this manufacturing process, the original photomask(s) are placed immediately back into production following the cleaning process is shown in the flowchart FIG. 16C. This has the potential of eliminating duplicate mask sets as well as decreasing the required setup times for using duplicate mask sets. The use of inspection metrology to verify the cleaning process may be advantageously used prior to returning the photomask back into production. This measurement may, for example, be incorporated into the apparatus or provided by an additional apparatus at the wafer fabrication or other facility. Regardless, of the metrology, the overall process time for the photomask haze removal will be reduced.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A method for cleaning a surface of a substrate, comprising:
   directing a laser towards a substrate having an absorption spectrum with at least one local maximum and at least one radiation-produced particle disposed thereon, the laser having an infrared wavelength that is substantially the same as the local maximum of the substrate absorption spectrum;
   generating a thermal increase in the substrate; and
   removing the radiation-produced particle from the substrate by transferring thermal energy from the substrate to the radiation-produced particle until the radiation-produced particle decomposes.

2. The method of claim 1, further comprising directing the laser through a protective material positioned above the substrate.

3. The method of claim 2, wherein the substrate is at least partially enclosed within a pellicle and the protective material is a pellicle film.

4. The method of claim 1, wherein laser wavelength is above 8 micrometers.

5. The method of claim 1, wherein said removing the radiation-produced particle includes laser absorption by the particle.

6. The method of claim 1, wherein the substrate includes at least one thin film layer.

7. The method of claim 6, wherein the thin film layer is patterned and includes void areas under which respective portions of the substrate are exposed.

8. The method of claim 1, further comprising maintaining a temperature of the substrate below a threshold temperature to prevent damage thereto.

9. The method of claim 1, wherein the substrate includes at least two materials and the laser wavelength is substantially the same as a local maximum of the absorption spectrum of one of the materials.

10. A method for increasing the useable lifetime of a photomask substrate, comprising:
    directing electromagnetic radiation through a protective material towards a photomask substrate having an absorption spectrum with at least one local maximum and radiation-produced particle contamination, the electromagnetic radiation having an infrared wavelength that is substantially the same as the local maximum of the photomask substrate absorption spectrum;
    generating a thermal increase in the photomask substrate; and
    removing at least a portion of the radiation-produced particle contamination by transferring thermal energy from the photomask substrate to the radiation-produced particle contamination until the radiation-produced particle contamination decomposes.

11. The method of claim 10, wherein the photomask substrate is at least partially enclosed within a pellicle and the protective material is a pellicle film.

12. The method of claim 10, wherein the substrate is quartz and the electromagnetic radiation wavelength is about 9 micrometers.

13. The method of claim 10, wherein said removing at least a portion of the radiation-produced particle contamination includes energy absorption by the particle contamination.

14. The method of claim 10, wherein the photomask substrate includes at least one thin film layer.

15. The method of claim 14, wherein the thin film layer is patterned and includes voids under which respective portions of the photomask substrate are exposed.

16. The method of claim 10, further comprising maintaining a temperature of the photomask substrate below a threshold temperature to prevent damage thereto.

17. The method of claim 10, wherein the substrate includes at least two materials and the electromagnetic radiation wavelength is substantially the same as a local maximum of the absorption spectrum of one of the materials.

18. A method for cleaning a surface of a substrate at least partially enclosed within a pellicle, comprising:
    directing a laser through a pellicle film towards a substrate having an absorption spectrum with at least one local maximum and a contaminating particle layer disposed thereon, the laser having an infrared wavelength that is substantially the same as the local maximum of the substrate absorption spectrum;
    generating a thermal increase in the substrate; and
    removing at least a portion of the contaminating particle layer from the substrate by transferring thermal energy from the substrate to the contaminating particle layer until the contaminating particle layer portion decomposes.

19. The method of claim 18, wherein the contaminating layer is a haze layer.

20. The method of claim 19, wherein the haze layer is an ammonium sulfate haze layer.

* * * * *